United States Patent [19]
Nakano

[11] Patent Number: 5,634,030
[45] Date of Patent: May 27, 1997

[54] SEMICONDUCTOR MEMORY DEVICE FOR INCREMENTING ADDRESS AT HIGH SPEED IN BURST ACCESS

[75] Inventor: Masahito Nakano, Tokyo, Japan

[73] Assignee: NEC Corporation, Tokyo, Japan

[21] Appl. No.: 357,255

[22] Filed: Dec. 13, 1994

[30] Foreign Application Priority Data

Dec. 22, 1993 [JP] Japan ................... 5-323597

[51] Int. Cl.[6] ............... G06F 9/26; G06F 13/28
[52] U.S. Cl. ............ 395/421.03; 395/855; 395/878; 395/421.09; 364/DIG. 1
[58] Field of Search ............. 395/421.03, 421.09, 395/464, 855, 878

[56] References Cited

U.S. PATENT DOCUMENTS 4,926,312  5/1990  Nukiyama ................ 395/375
5,192,882  3/1993  Lipovski ..................... 326/37

FOREIGN PATENT DOCUMENTS 3156789  7/1991  Japan.

Primary Examiner—Tod R. Swann
Assistant Examiner—J. Peikari
Attorney, Agent, or Firm—Sughrue, Mion, Zinn, Macpeak & Seas

[57] ABSTRACT

A semiconductor memory device has an address generating system for a burst access mode, and the address generating system previously generates the next internal address through an exclusive-OR operation during supply of a present internal address, thereby quickly changing the internal address in synchronism with an internal clock signal.

5 Claims, 9 Drawing Sheets

SEMICONDUCTOR MEMORY DEVICE FOR INCREMENTING ADDRESS AT HIGH SPEED IN BURST ACCESS

FIELD OF THE INVENTION

This invention relates to a semiconductor memory device and, more particularly, to a semiconductor memory device for a burst access.

DESCRIPTION OF THE RELATED ART

A semiconductor memory device with a burst access mode is attractive to a computer system designer, because a microprocessor gives only a starting address to the semiconductor memory device for a sequential access to related addresses. Japanese Patent Publication of Unexamined Application No. 3-156789 discloses a single-port memory device with the burst access mode.

A built-in address generator is indispensable for the burst access, and FIG. 1 illustrates a typical example of the built-in address generating system for the burst access. Reference numeral 1 designates the prior art built-in address generating system, and the built-in address generating system 1 supplies an internal address signal AI to other peripheral circuits 2 for a sequential access to memory cells 3.

The built-in address generating system 1 comprises a controlling unit 1a responsive to an external address status signal ADSC of active low level and an external burst advance input signal ADV of the active low level for generating a first control signal CKL and a second control clock signal CKB in synchronism with an external clock signal CKX.

The built-in address generating system 1 further comprises a counter 1b cleared to zero with the first control signal CKL and a latch circuit 1c responsive to the first control signal CKL for storing an external address signal AX indicative of a starting address for the burst access. The counter 1b is responsive to the second control clock signal CKB for changing the value of a count signal CV. If the counter 1b reaches the maximum value, the counter 1b returns to the initial value of zero.

The built-in address generating system 1 further comprises a logic circuit 1d for generating the internal address signal AI. Namely, the external address signal AX is supplied from the latch circuit 1c to the logic circuit 1d, and the logic circuit 1d carries out a logical operation on the external address signal AX and the count signal CV. If the count signal CV is a two-bit signal, the two bits CV1 and CV0 are sequentially changed as shown in Table 1.

TABLE 1

|  | high-order bit CV1 | low-order bit CV0 |
|---|---|---|
| initial value | 0 | 0 |
| first burst | 0 | 1 |
| second burst | 1 | 0 |
| third burst | 1 | 1 |

The logic circuit 1d carries out the exclusive-OR operation or the addition. Assuming now that the external address signal AX has a high-order bit "0" and a low-order bit "0", the exclusive-OR operation initially yields the internal address signal AI of (0,0), then changing the internal address signal to (0, 1) in the first burst, (1,0) in the second burst and (1,1) in the third burst as shown in FIG. 2A. The sequential change shown in FIG. 2A is called as "interleave".

On the other hand, the addition initially generates the internal address signal of (0,0), then also changing the internal address signal to (0,1) in the first burst, (1,0) in the second burst and (1,1) in the third burst as shown in FIG. 2B.

The exclusive-OR operation on the addres signals AX1 and AX0 is shown in Table 2, and is corresponding to FIG. 2A.

TABLE 2

| External Address Ax or Internal Address Ai | 00 | 01 | 10 | 11 |
|---|---|---|---|---|
| First burst | 01 | 00 | 11 | 10 |
| Second burst | 10 | 11 | 00 | 01 |
| Third burst | 11 | 10 | 01 | 00 |

On the other hand, the addition corresponding to FIG. 2B is shown in Table 3.

TABLE 3

| External Address Ax or Internal Address Ai | 00 | 01 | 10 | 11 |
|---|---|---|---|---|
| First burst | 01 | 10 | 11 | 00 |
| Second burst | 10 | 11 | 00 | 01 |
| Third burst | 11 | 00 | 01 | 10 |

FIGS. 7 and 8 illustrates the circuit arrangement of the counter 1b and the circuit arrangement of the latch/logic circuits 1c and 1d. The counter 1b has a predecoder 1e, two latch circuits 1f and 1g, a reset circuit 1h and an incremental controller 1i. The predecoder 1e generates complementary signals CCKL and CCKB from the first control signal CKL and the second control clock signal CKB, and the first control signal CKL and the second control clock signal CKB and the complementary signals CCKL and CCKB are selectively distributed to the latch circuits 1f and 1g, the reset circuit 1h and the component logic gates of the incremental controller 1i. The latch circuits 1f and 1g produce a low-order bit CV0 and a high-order bit CV1 and the complementary bits CCV0 and CCV1, and the low-order bit CV0, the high-order bit CV1 and the complementary signals CCV0 and CCV1 form the count signal CV.

The reset circuit 1h rests the low-order bit CV0 and the high-order bit CV1 to zero or a low voltage level and the complementary bits CCV0 and CCV1 to one or a high voltage level at the leading edge of the first control signal CKL. The incremental controller 1i sequentially increments the value indicated by the bits CV0 and CV1 at every leading edge of the second control clock signal CKB.

The latch circuit 1c comprises two latch sub-circuits for storing a low-order external address bit AX0 and a high-order external address bit AX1, and each of the latch sub-circuits comprises an inverter INV1 for producing the complementary signal CCKL of the first control signal CKL, two latch units 1j and 1k and a timing controlling circuit 1m. N1 and N2 designate nodes, respectively, and are referred to in FIG. 9. The external address bits AX0 and AX1 are latched by the latch units 1k at the leading edge of the first control signal CKL under the control of the timing controlling circuits 1m, and are maintained until the next first control signal CKL.

The logic circuit 1d also has two logic sub-circuits. One of the logic sub-circuits carries out the exclusive-OR operation on the external address bit AX0 and the low-order bit CV0 for producing a low-order internal address bit AI0, and the other logic sub-circuit also carries out the exclusive-OR operation on the external address bit AX1 and the high-order bit CV1 for producing a high-order internal address bit AI1. N3 designates an input node of an output inverter INV2.

FIG. 5 illustrates the internal address generation. If the address status signal ADSC is changed to the active low level at time t1, the control circuit 1a shifts the first control signal CKL to the high level in synchronism with the leading edge of the external clock signal CKX at time t2. With the first control signal CKL, the counter 1b is initialized or cleared to zero. In response to the first control signal CKL, the latch circuit 1c stores the external address signal AX at the leading edge of the first control signal CKL. The external address bits AX0 and AX1 are exclusive-ORed with the count signal CV, and the internal address bits AI0 and AI1 are determined at time t3. The exclusive-OR operation introduces a time delay td0.

The burst advance signal ADV is changed to the active low level at time t4, and the control circuit 1a changes the second control clock signal CKB to the high level at time t5. In response to the second control clock signal CKB, the counter 1b changes the count signal CV at time t6, and the logic circuit 1d changes the internal address signal AI through the exclusive-OR operation at time t7. The counter 1b and the exclusive-OR operation introduce a time delay td1 between the leading edge of the second control clock signal CKB and the internal address signal AI.

The second control clock signal CKB rises at time t8, t11, t14 and t17 for the second, third and fourth bursts, and the counter 1b changes the count signal CV at time t9, t12, t15 and t18. As a result, the internal address signal AI is changed at time t10, t13, t16 and t19, and time delays td2, td3, td4 and td5 are introduced between the leading edges of the second control clock signal CKB and the changes of the internal address signal AI.

The prior art built-in address generating system encounters a problem in that the time delays td0 to td5 slow down the burst access.

SUMMARY OF THE INVENTION

It is therefore an important object of the present invention to provide a semiconductor memory device which is improved in the burst access.

To accomplish the object, the present invention proposes to prepare a calculated address while a previous internal address is being output.

In accordance with the present invention, there is provided a semiconductor memory device comprising: a) a plurality of memory cells for storing data bits; b) peripheral circuits responsive to an internal address signal for selectively making the plurality of memory cells accessible; and c) an address generating system operative to change an internal address represented by the internal address signal for sequential burst accesses, and having c-1) a controlling circuit responsive to a first external control signal for changing a first control signal between a first level and a second level in synchronism with an external clock signal and to a second external control signal for changing a second control clock signal between a third level and a fourth level in synchronism with the external clock signal, c-2) a first latch circuit responsive to the first control signal of the second level for storing an external address signal indicative of an external address, c-3) a second latch circuit responsive to the first control signal of the second level for producing the internal address signal indicative of a first internal address from the external address, the second latch circuit storing the external address upon recovery of the first control signal to the first level, c-4) a counter responsive to the first control signal of the second level for setting a count signal to a first value used for producing a second internal address, and changing the count signal at every change of the second control clock signal from the third level to the fourth level, c-5) a calculated address producing circuit operative to produce a calculated address from the external address stored in the first latch circuit and the value of the count signal, c-6) a third latch circuit responsive to the second control clock signal of the third level for storing the calculated address, and c-7) a transfer circuit responsive to the second control clock signal of the fourth level for transferring the calculated address from the third latch circuit to the second latch circuit, thereby causing the second latch circuit to change the internal address to the calculated address.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENT

Figure 6:
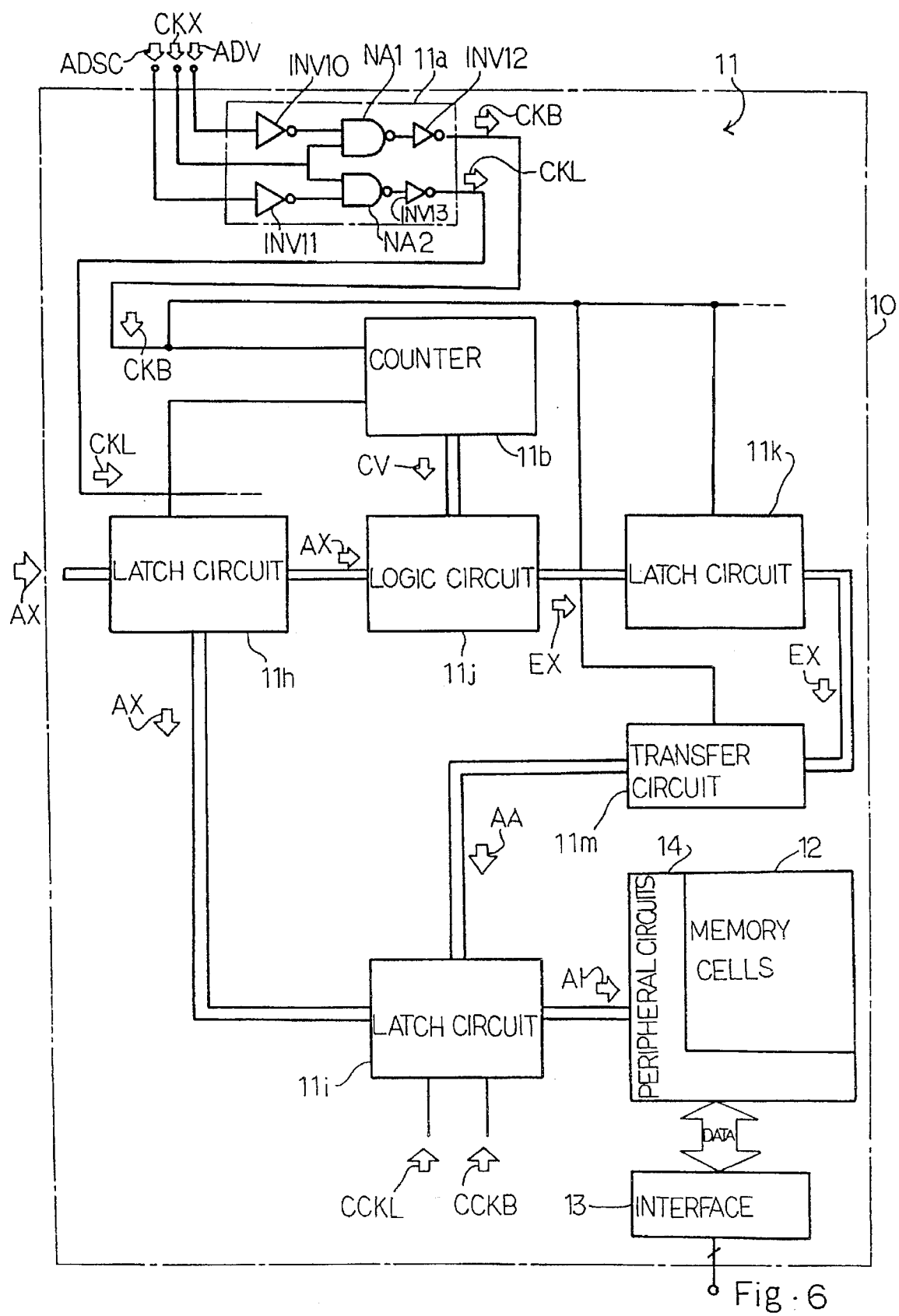
FIG. 6 is a block diagram showing the circuit arrangement of an address generating system incorporated in a semiconductor memory device according to the present invention.

Referring to FIG. 6 of the drawings, a semiconductor memory device embodying the present invention is fabricated on a single semiconductor chip 10, and largely comprises an address generating system 11 for a burst access mode, a memory cell array 12 for storing data bits, an interface 13 for receiving an input data signal and delivering an output data signal and other peripheral circuits 14 for carrying out a write-in operation and a read-out operation on the memory cell array 12. Description is made on the assumption that an external address signal AX is two bit signal. However, the description is easily extensible to an arbitrary n bit external address signal by replacing "two" with n.

The address generating system 11 comprises a controlling circuit 11a implemented by two inverters INV10, INV11, INV12 and INV13 and two NAND gates NA1 and NA2. A burst advance input signal ADV and an address status signal ADSC are respectively supplied to the inverters INV10 and INV11, and the complementary signals of a high level enable the NAND gates NA1 and NA2, respectively. The NAND gates NA1 and NA2 thus enabled are responsive to the external clock signal CKX, and the inverters INV12 and INV13 change a first control signal CKL and a second control clock signal CKB between a high level and a low level in synchronism with the external clock signal CKX.

The address generating system 11 further comprises a counter 11b controlled by the first control signal CKL and the second control clock signal CKB for changing the value of a two-bit counter signal CV. The standard value of the counter signal CV is zero, and the counter 11b changes the value of the count signal CV in synchronism with the leading edge of the second control clock signal CKB as shown in Table 4.

TABLE 4

|  | high-order bit CV1 | low-order bit CV0 |
| --- | --- | --- |
| initial value | 0 | 1 |
| first change | 1 | 0 |
| second change | 1 | 1 |
| third change | 0 | 0 |

The counter 11b is further responsive to the first control signal CKL for setting the count signal CV to the initial value (0,1) next to the standard value. The initial value is different from that of the prior art.

Figure 7:
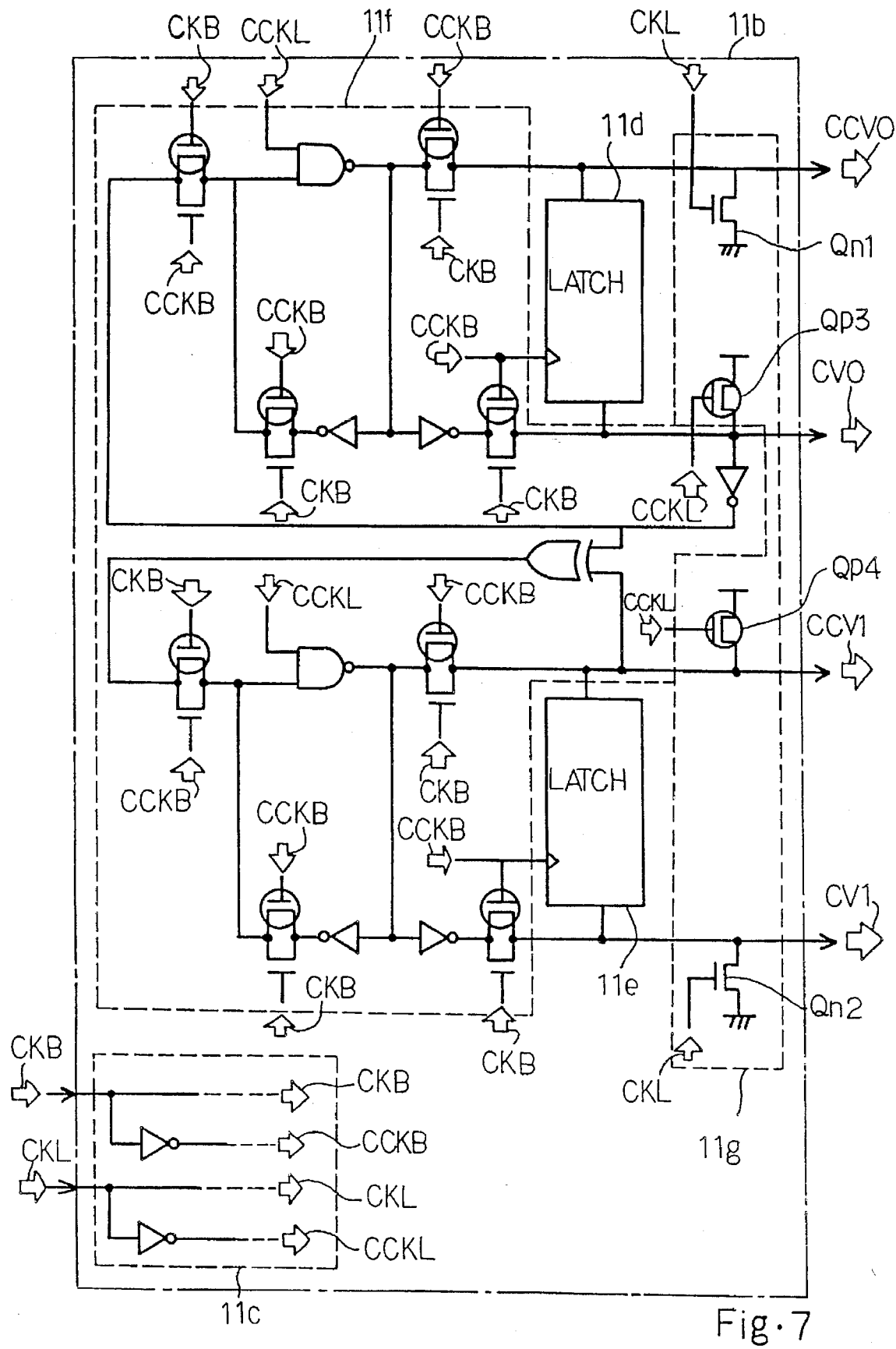
FIG. 7 is a circuit diagram showing the arrangement of a counter incorporated in the address generating system.

The circuit arrangement of the counter 2 is illustrated in FIG. 7, and comprises a signal predecoder 11c for producing the complementary signals CCKB and CCKL, two latch circuits 11d and 11e, an incremental controller 11f and an initial value generator 11g. The signal predecoder 11c, the latch circuits 11d and 11e and the incremental controller 11f are similar to those of the prior art. However, the initial value generator 11g is different from the resetting circuit 1h. Namely, n-channel enhancement type switching transistors Qn1 and Qn2 supply the ground voltage for the complementary bit CCV0 and the high-order bit CV1, and p-channel enhancement type switching transistors Qp3 and Qp4 supply a positive power voltage for the low-order bit CV0 and the complementary bit CCV1. Therefore, when the first control signal CKL is changed to the high level, the high-order bit CV1 and the low-order bit CV0 are set to zero and one, respectively.

Figure 1:
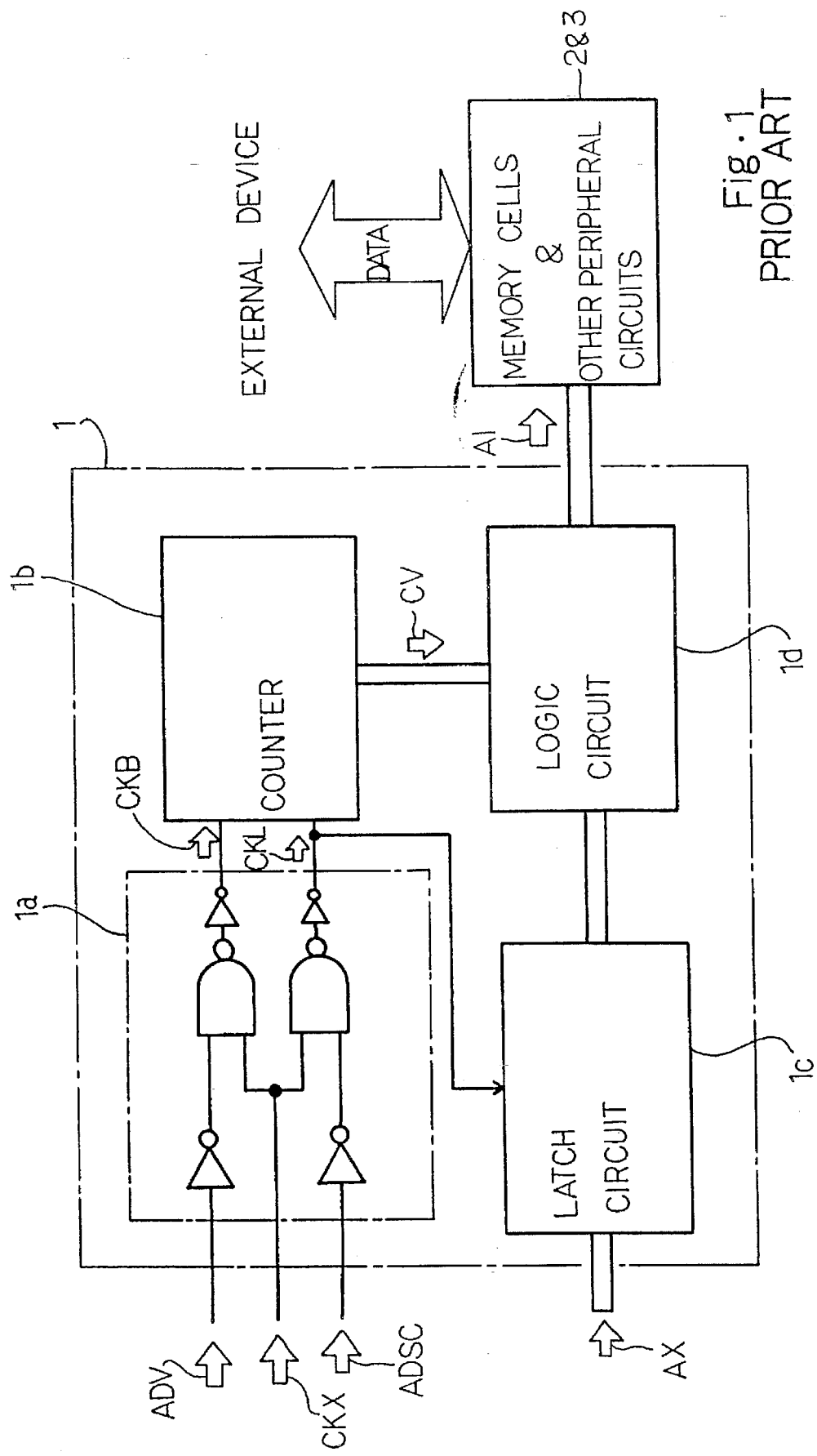
FIG. 1 is a block diagram showing the arrangement of the prior art built-in address generating system.
Figure 2A:
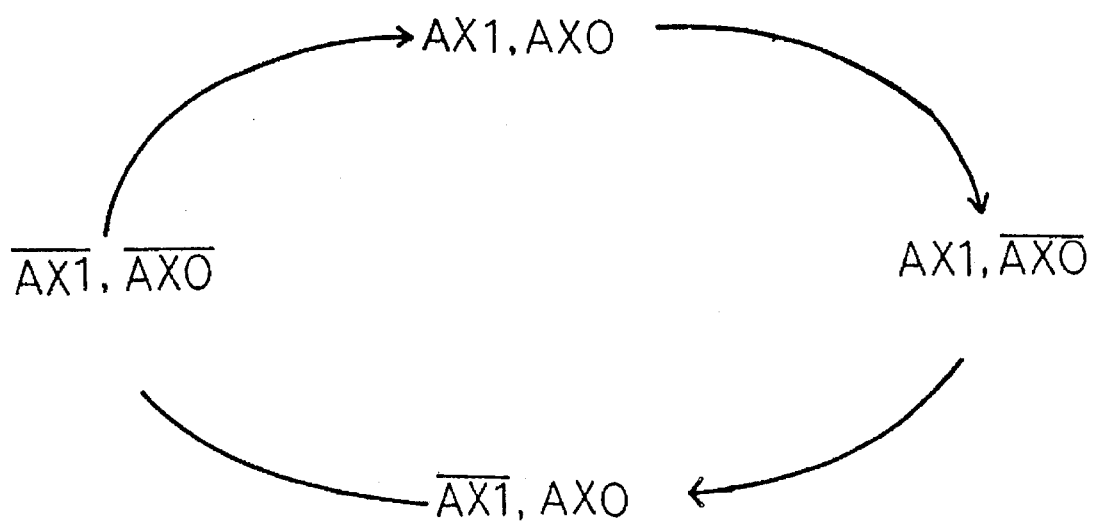
FIGS. 2A and 2B are views showing the change of the internal address through the function of the logic circuit incorporated in the prior art built-in address generating system.
Figure 2B:
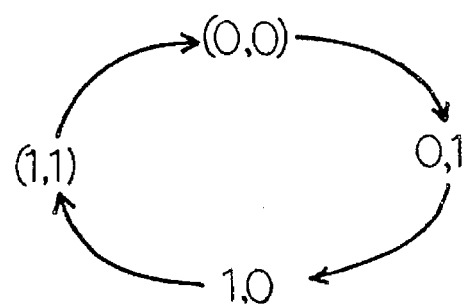
Figure 3:
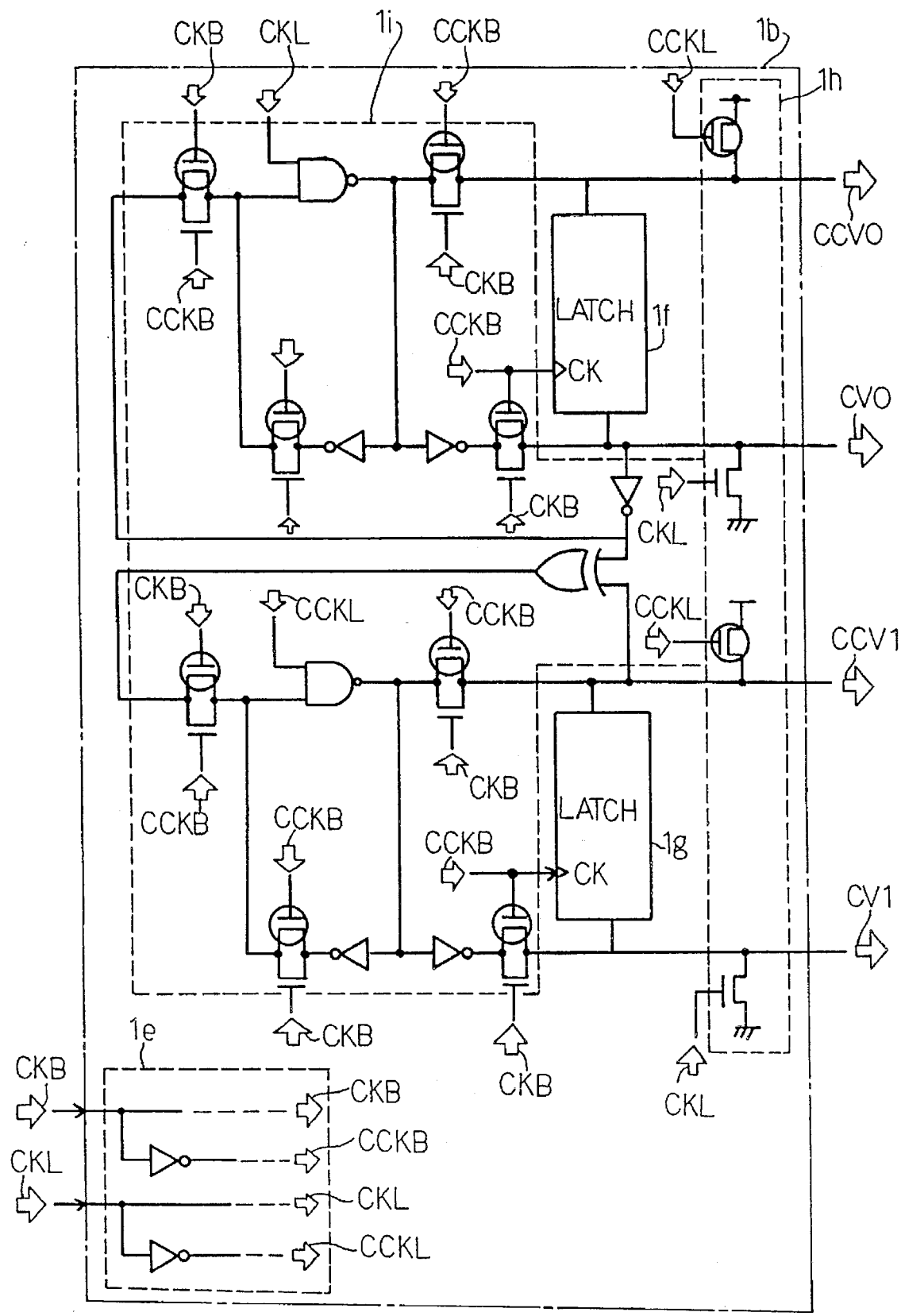
FIG. 3 is a circuit diagram showing the counter incorporated in the prior art built-in address generating system.
Figure 4:
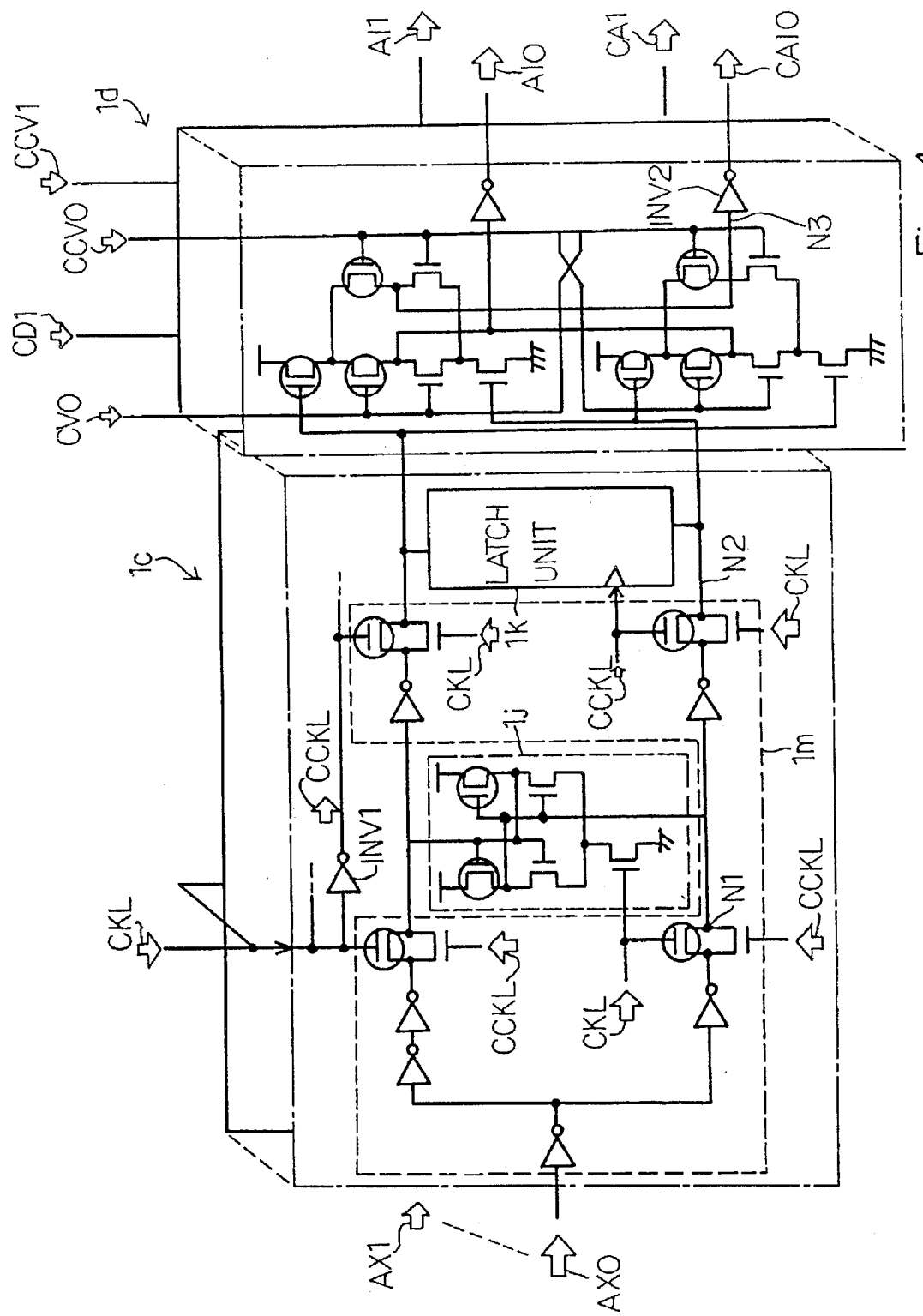
FIG. 4 is a circuit diagram showing the latch circuit and the logic circuit of the prior art built-in address generating system.
Figure 5:
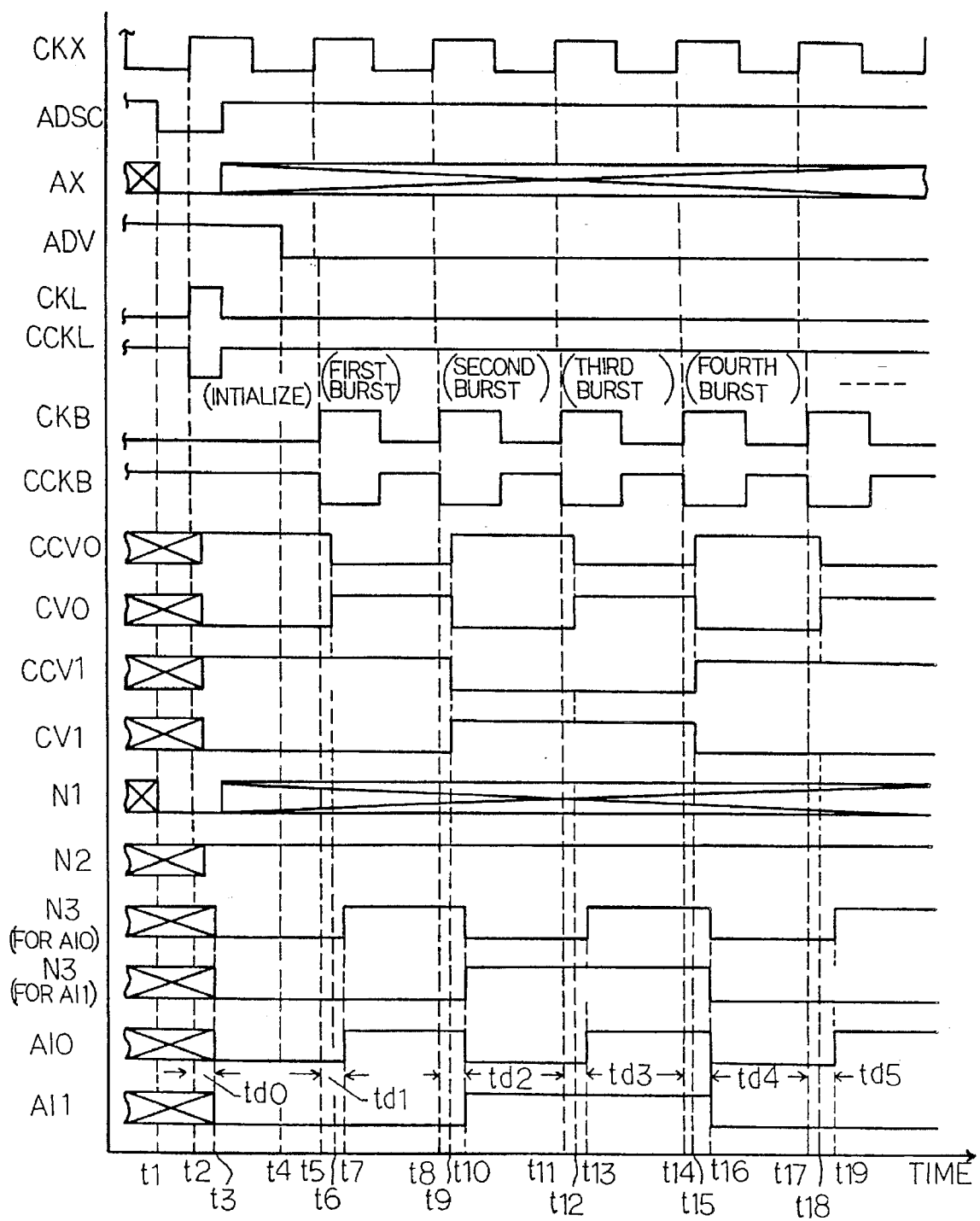
FIG. 5 is a timing chart showing the address generation in the prior art built-in address generating system in the burst access mode.

Turning back to FIG. 6 of the drawings, the address generating system 11 further comprises a first latch circuit 11h for storing the two-bit external address signal AX, a second latch circuit 11i for storing the external address signal AX at the same timing as the first latch circuit 11h and a logic circuit 11j for carrying out the exclusive-OR operation on the external address signal AX and the count signal CV. The first latch circuit 11h and the logic circuit 11j are similar in circuit arrangement to those of the prior art, and are detailed in FIG. 4. The references used in FIG. 4 are labeled for the corresponding components and nodes of those circuits 11h and 11j in FIG. 8.

Figure 8:
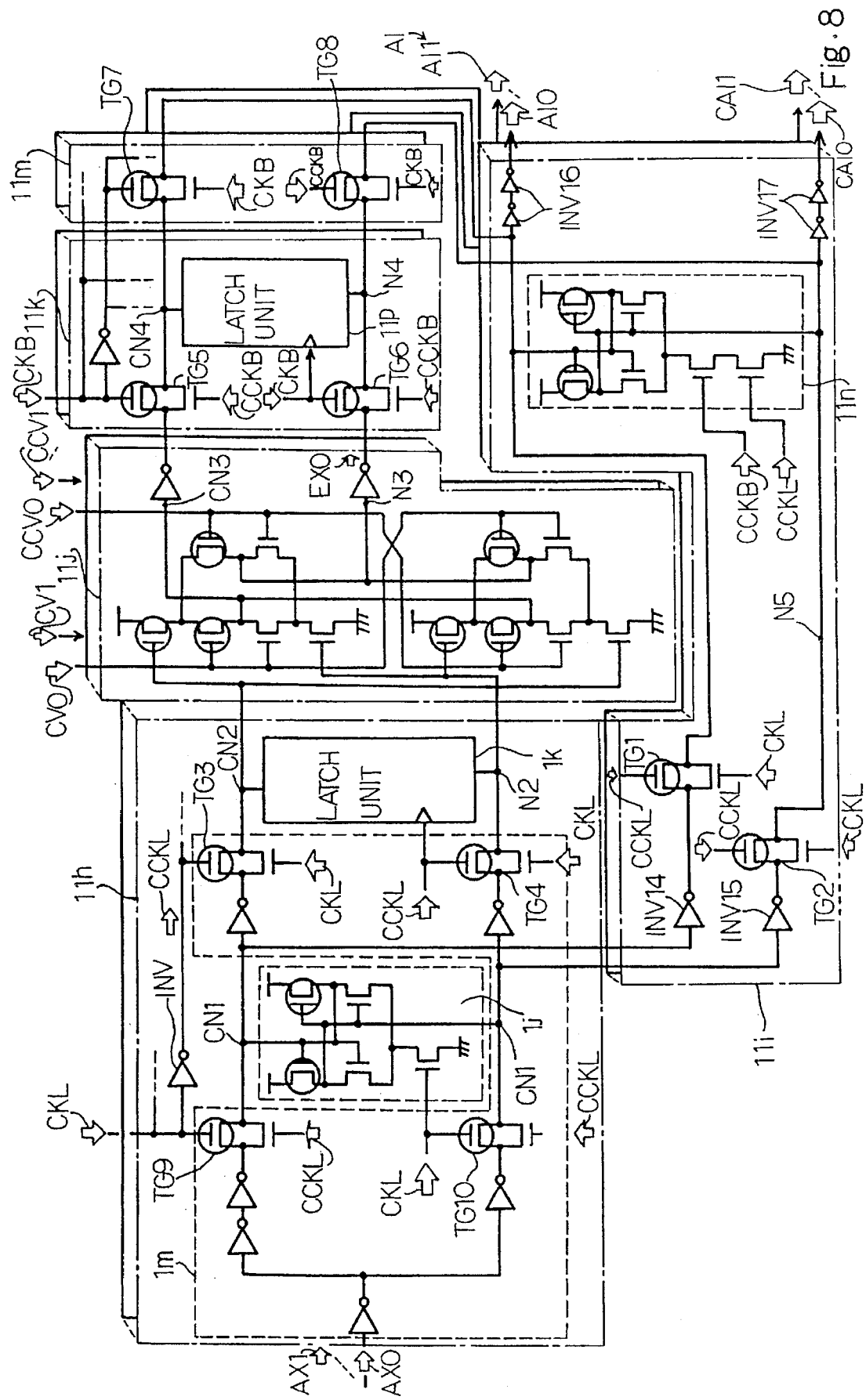
FIG. 8 is a circuit diagram showing the arrangement of first to third latch circuits, a logic circuit and a transfer circuit incorporated in the address generating system.

As show in FIG. 8, the second latch circuit 11i is implemented by two second latch sub-circuits each comprising inverters INV14 and INV15, transfer gates TG1 and TG2, a latch unit 11n enabled with the complementary signals CCKB and CCKL for storing the external address bit AX0/AX1 and inverters INV16 and INV17 for supplying an internal address signal AI. The external address bits AX0 and AX1 are transferred in parallel from the nodes CN1/CCN1 through the transfer gates TG3/TG4 and TG1/TG2 to the latch units 1k and 11n, and the external address bits AX0/AX1 are stored in the latch units 1k and 11n at the same timing.

Turning back to FIG. 6, the address generating system 11 further comprises a third latch circuit 11k responsive to the second control clock signal CKB for storing an output signal EX of the logic circuit 11j and a transfer circuit 11m responsive to the second control clock signal CKB for transferring the output signal EX to the second latch circuit 11i. The third latch circuit 11k is implemented by two third latch sub-circuits each having a latch unit 11p and transfer gates TG5 and TG6, and the transfer gates TG5 and TG6 are responsive to the second control clock signal CKB and the complementary signal CCKB for transferring the output signal EX from the logic circuit 11j to the latch units 11p.

The transfer circuit 11m is also implemented by two transfer sub-circuits each implemented by a pair of transfer gates TG7 and TG8. The transfer gates TG7 and TG8 are responsive to the second control clock signal CKB and the complementary signal CCKB for transferring the output signal EX to the second latch circuit 11i as a calculated address signal AA. The input nodes of the inverters INV16 and INV17 are coupled to both of the latch units 11n and the transfer circuit 11m, and selectively invert the external address signal EX and the calculated address signal AA. The internal address signal AI is supplied from the output nodes of the inverters INV16 and INV17 to the peripheral circuits 14, and the peripheral circuits provide a data path between the memory cell array 12 and the interface 13 for a burst access.

In this instance, the logic circuit 11j serves as a calculated address producing circuit. First and third levels are equivalent to the low level, and second and fourth levels are equivalent to the high level.

Figure 9:
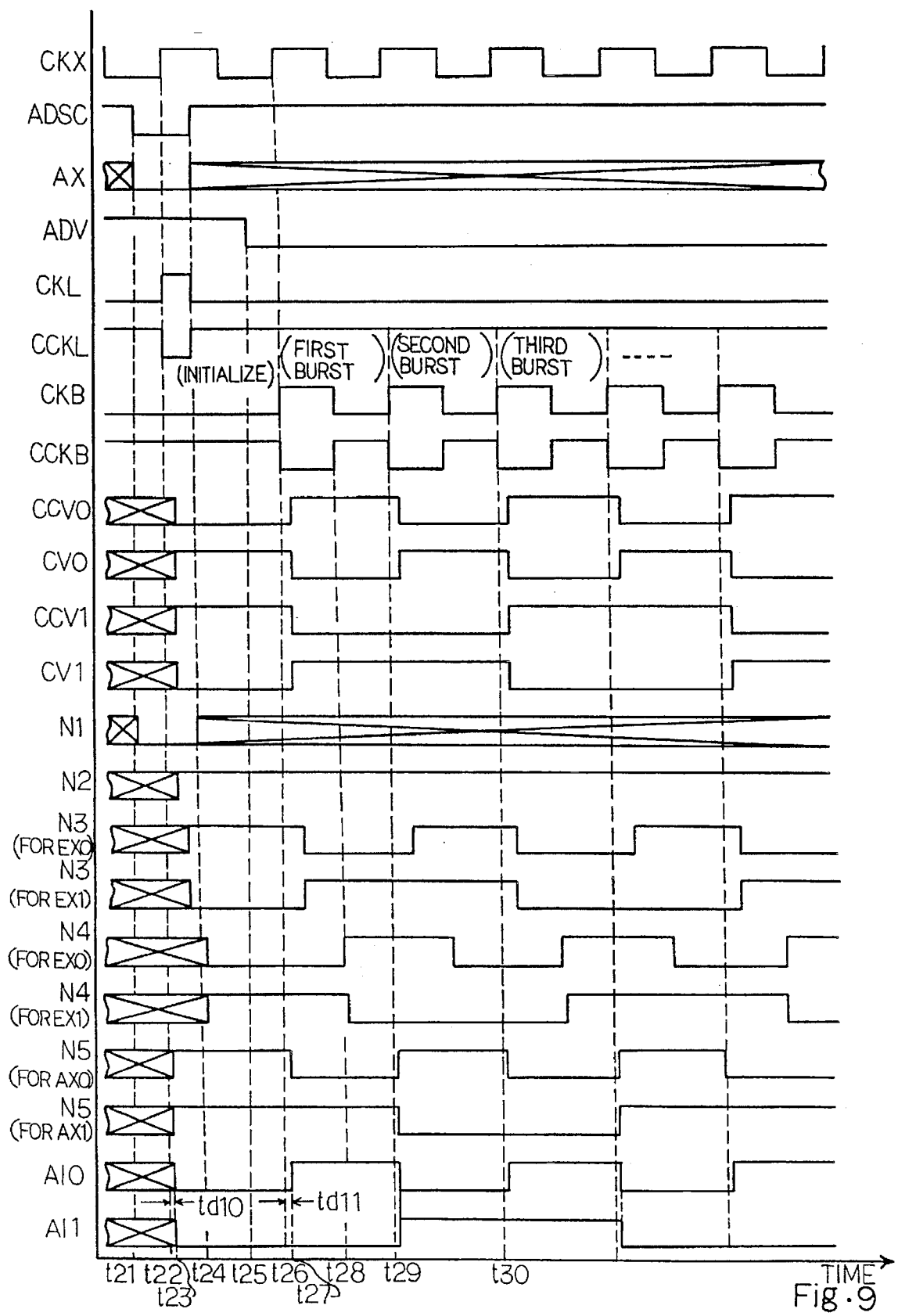
FIG. 9 is a timing chart showing an address generation in a burst access mode carried out by the address generating system.

The address generating system 11 behaves in a burst access mode as follows. FIG. 9 illustrates an address generation in the burst access mode. Assuming now that the address status signal ADSC is changed to the active low level at time t21. The external address signal AX is transferred to the nodes CN1/CCN1, because transfer gates TG9/TG10 (see FIG. 8) are turned on in the presence of the first control signal CKL of the low level. Moreover, the address status input signal ADSC enables the NAND gate NA2, and the NAND gate NA2 changes the first control signal CKL to the high level in synchronism with the leading edge of the external clock signal CKX at time t22. The first control signal CKL of the high level causes the transfer gates TG3/TG4 and the transfer gates TG1/TG2 to concurrently turn on. The transfer gates TG3 and TG4 transfer the external address signal AX to the latch units 1k, and the latch units 1k store the external address signal AX.

On the other hand, the transfer gates TG1 and TG2 transfer the external address signal AX directly to the inverters INV16 and INV17, and the inverters INV16 and INV17 produce the internal address signal AI at time t23. However, the complementary signal CCKL of the low level does not enable the latch units 11n, and the first internal address is not stored in the latch units 11n.

Thus, the first internal address (00) is directly determined by the external address represented by the external address signal AX without any logic operation, and only the signal propagation to the inverters INV16 and INV17 introduces a time delay td10. For this reason, the time delay td10 is shorter than the time delay td0.

The external address signal AX latched by the latch units 1k is exclusive-ORed with the initial value "01" of the counter signal CV by the logic circuit 11*j*, and the output signal EX reaches the latch units 11*p* through the transfer gates TG5 and TG6 because the second control clock signal CKB is in the low level. However, the transfer circuit 11*m* blocks the inverters INV16 and INV17 from the output signal EX, because the second control signal CKB of the low level does not allow the transfer gates TG7 and TG8 to turn on. Thus, while the second latch circuit 11*i* is outputting the internal address signal indicative of the first address identical with the external address, the calculated address AA is prepared and previously stored in the third latch circuit 11*k*. This feature accelerates the generation of the second to third bursts as described hereinbelow.

If the first control clock CKL is changed to the low level at time t24 due to the recovery of the address status signal ADSC to the inactive high level, the transfer gates TG3/TG4 and TG1/TG2 turn off, and the latch units 1*k* store the external address (00), and the latch units 11*n* is isolated from the first latch circuit 11*h*. Both of the complementary signals CCKB and CCKL are in the high level, and the first internal address (00) is stored in the latch units 11*n*.

The burst advance input signal ADV goes down to the active low level at time t25, and the controller 11*a* changes the second control clock signal CKB to the high level in synchronism with the leading edge of the external clock signal CKX at time t26. Then, the transfer gates TG7 and TG8 turn on, and the transfer circuit 11*m* supplies the calculated address (01) to the inverters INV16 and INV17. Then, the internal address signal AI is changed to the second address (01), and only the signal propagation from the third latch circuit 11*k* to the inverters INV16/INV17 introduces a time delay td11. The time delay td11 is shorter than the time delay td1, and the calculated address accelerates the burst access.

While the calculated address (01) is being transferred to the inverters INV16/INV17, the transfer gates TG5 and TG6 turn off, and the counter 11*b* increments the counter signal CV to (10), and the logic circuit 11*j* yields the output signal EX of (10).

If the second control clock signal CKB is changed to the low level at time t28, the output signal EX of (10) is transferred through the transfer gates TG5 and TG6 to the latch units 11*p*, and is stored therein as the calculated address (10). The transfer gates TG7 and TG8 turn off, and the transfer circuit 11*m* isolates the second latch circuit 11*i* from the third latch circuit 11*k*. The latch units 11*n* stores the second internal address (01), and the inverters INV16 and INV17 continuously supply the second internal address.

The second control clock signal CKB is changed at time t29 and time t30, and a third internal address (10) and a fourth internal address (11) are produced in the similar manner to the second internal address. The third and fourth internal addresses are supplied to the peripheral circuits 14 for second and third burst accesses.

In the above described embodiment, the logic circuit 11*j* carries out an exclusive-OR operation. However, a logic circuit of another implementation may add a counter value to the external address, and an adder well known to a person skilled in the art is available.

As will be appreciated from the foregoing description, the logic circuit 11*j* generates a calculated address indicative of the next internal address while the second latch circuit 11*i* is supplying the current internal address, and the time delay is only due to the signal propagation. As a result, the address generating system according to the present invention accelerates the burst access, and an extremely high-speed semiconductor memory device is achieved.

Although a particular embodiment of the present invention has been shown and described, it will be obvious to those skilled in the art that various changes and modifications may be made without departing from the spirit and scope of the present invention. For example, the semiconductor memory device according to the present invention may form a part of a large scale integration together with other function blocks.

Moreover, the semiconductor memory device according to the present invention may allow an external device to access stored data not only through the burst accessing sequence but also through a standard accessing sequence.

What is claimed is:

1. A semiconductor memory device comprising:

a) a plurality of memory cells for storing data bits;

b) peripheral circuits responsive to an internal address signal for selectively making said plurality of memory cells accessible; and c) an address generating system operative to change an internal address represented by said internal address signal for sequential burst accesses, and having c-1) a controlling circuit responsive to a first external control signal for changing a first control signal between a first level and a second level in synchronism with an external clock signal and to a second external control signal for changing a second control clock signal between a third level and a fourth level in synchronism with said external clock signal, c-2) a first latch circuit responsive to said first control signal of said second level for storing an external address signal indicative of an external address, c-3) a second latch circuit responsive to said first control signal of said second level for producing said internal address signal indicative of a first internal address from said external address, said second latch circuit storing said external address upon recovery of said first control signal to said first level, c-4) a counter responsive to said first control signal of said second level for setting a count signal to a first value used for producing a second internal address, and changing said count signal at every change of said second control clock signal from said third level to said fourth level, c-5) a calculated address producing circuit operative to produce a calculated address from said external address stored in said first latch circuit and the value of said count signal, c-6) a third latch circuit responsive to said second control clock signal of said third level for storing said calculated address, and c-7) a transfer circuit responsive to said second control clock signal of said fourth level for transferring said calculated address from said third latch circuit to said second latch circuit, thereby causing said second latch circuit to change said internal address to said calculated address.

2. The semiconductor memory device as set forth in claim 1, in which said first latch circuit stores said external address at a first timing when said first control signal is changed from said first level to said second level, said second latch circuit starting to produce said internal address signal indicative of said first internal address from said external address at said first timing, said counter setting said count signal to said first value used for producing said second internal address at said first timing, said calculated address generating circuit immediately producing said calculated address indicative of said second internal address from said external address and said first value of said counter signal, said third latch circuit being enabled to store said calculated address indicative of said second internal address at said first timing, said transfer circuit transferring said calculated address indicative of said second internal address at a second timing after said first timing when said second control clock signal is changed from said third level to said fourth level, said third latch circuit being disabled at said second timing, said second latch circuit storing said second internal address at a third timing after said second timing when said second control clock signal is changed from said fourth level to said third level, said transfer circuit turning off at said third timing.

3. The semiconductor memory device as set forth in claim 2, in which said counter changes said count signal to a second value used for producing a third internal address at said third timing, said calculated address producing circuit immediately producing said calculated address indicative of said third internal address, said third latch circuit being enabled to store said calculated address indicative of said third internal address at said third timing, said transfer circuit transferring said calculated address indicative of said third internal address from said third latch circuit to said second latch circuit for changing said internal address signal to said third internal address at a fourth timing after said third timing when said second control clock signal is changed from said fourth level to said third level.

4. The semiconductor memory device as set forth in claim 1, in which said calculated address producing circuit produces said calculated address through an exclusive-OR operation on said external address and the value of said count signal.

5. The semiconductor memory device as set forth in claim 1, in which said calculated address producing circuit produces said calculated address through an adding operation on said external address and the value of said count signal.

* * * * *